US012772738B2

(12) United States Patent
Yano et al.

(10) Patent No.: US 12,772,738 B2
(45) Date of Patent: Oct. 20, 2026

(54) PIEZOELECTRIC ELEMENT, LIQUID EJECTION HEAD, AND PRINTER

(71) Applicant: SEIKO EPSON CORPORATION, Tokyo (JP)

(72) Inventors: Yoshiki Yano, Chino (JP); Tsukasa Hitomi, Chino (JP); Daisuke Nagano, Matsumoto (JP); Shu Okada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 108 days.

(21) Appl. No.: 19/000,493

(22) Filed: Dec. 23, 2024

(65) Prior Publication Data

US 2025/0212690 A1 Jun. 26, 2025

(30) Foreign Application Priority Data

Dec. 26, 2023 (JP) ................................ 2023-219293

(51) Int. Cl.
*H10N 30/50* (2023.01)
*B41J 2/14* (2006.01)
(Continued)

(52) U.S. Cl.
CPC ........ *H10N 30/508* (2023.02); *B41J 2/14233* (2013.01); *H10N 30/2048* (2023.02); *H10N 30/708* (2024.05); *H10N 30/8542* (2023.02); *B41J 2002/14258* (2013.01); *B41J 2002/14306* (2013.01)

(58) Field of Classification Search
CPC ............. H10N 30/508; H10N 30/2048; H10N 30/708; H10N 30/8542; H10N 30/078; H10N 30/2047; B41J 2/14233; B41J 2002/14258; B41J 2002/14306; B41J 2002/14419; B41J 2202/03; B41J 2002/14241; B41J 2002/14491; B41J 2/14201
See application file for complete search history.

(56) References Cited

U.S. PATENT DOCUMENTS

| | | | | |
|---|---|---|---|---|
| 2018/0233656 | A1 * | 8/2018 | Kitada | H10N 30/20 |
| 2021/0188657 | A1 | 6/2021 | Tsujiuchi et al. | |

FOREIGN PATENT DOCUMENTS

| | | | |
|---|---|---|---|
| JP | 2019220638 | A | 6/2018 |
| JP | 2018133458 | A | 8/2018 |

* cited by examiner

*Primary Examiner* — Lisa Solomon
(74) *Attorney, Agent, or Firm* — WORKMAN NYDEGGER

(57) ABSTRACT

A piezoelectric element includes: a first electrode; a second electrode; and a piezoelectric layer provided between the first electrode and the second electrode and including a plurality of layers containing a complex oxide having a perovskite type structure containing potassium, sodium, and niobium, in which an X-ray diffraction method is used to measure asymmetric reflection of the piezoelectric layer in a range in which $\sin^2\psi$ is 0 or more and 0.7 or less, $\psi$ being a tilt angle, an obtained peak is separated into a high-angle-side peak and a low-angle-side peak, a lattice constant in a thickness direction of the piezoelectric layer is obtained based on the low-angle-side peak, and in a case where a plurality of the lattice constants are plotted for the range, when a plurality of plots are linearly approximated by a least squares method, a slope of an approximate straight line is 0.002 or less.

8 Claims, 7 Drawing Sheets

(51) Int. Cl.

| | |
|---|---|
| ***H10N 30/00*** | (2023.01) |
| ***H10N 30/20*** | (2023.01) |
| ***H10N 30/853*** | (2023.01) |

FIG. 10

| | SOLVENT RATIO | KNN CONCENTRATION [vol%] | LATTICE CONSTANT AT $\psi = 0°$ [Å] | | | SLOPE OF APPROXIMATE STRAIGHT LINE | | CRACK-RESISTANT FILM THICKNESS [nm] | CROSS-SECTIONAL MORPHOLOGY |
|---|---|---|---|---|---|---|---|---|---|
| | | | LONGITUDINAL | HORIZONTAL | DIFFERENCE | LONGITUDINAL | HORIZONTAL | | |
| EXAMPLE 1 | 0.424 | 45 | 4.0155 | 3.9224 | 0.0931 | −0.0121 | −0.0387 | MORE THAN 1000 | COLUMNAR |
| EXAMPLE 2 | 0.669 | 45 | 4.0206 | 3.9237 | 0.0969 | −0.0209 | −0.0394 | MORE THAN 1000 | COLUMNAR |
| EXAMPLE 3 | 0.304 | 45 | 4.0142 | 3.9234 | 0.0908 | −0.0120 | −0.0392 | MORE THAN 1000 | COLUMNAR |
| EXAMPLE 4 | 0.424 | 25 | 4.0060 | 3.9240 | 0.0820 | 0.0020 | −0.0450 | MORE THAN 1000 | COLUMNAR |
| COMPARATIVE EXAMPLE 1 | 0.424 | 45 | 3.9932 | 3.9267 | 0.0665 | 0.0695 | −0.0015 | 600 | RANDOM |

PIEZOELECTRIC ELEMENT, LIQUID EJECTION HEAD, AND PRINTER

The present application is based on, and claims priority from JP Application Serial Number 2023-219293, filed Dec. 26, 2023, the disclosure of which is hereby incorporated by reference herein in its entirety.

BACKGROUND

1. Technical Field

The present disclosure relates to a piezoelectric element, a liquid ejection head, and a printer.

2. Related Art

A piezoelectric element used in a liquid ejection head or the like of an inkjet printer is implemented by, for example, sandwiching a piezoelectric layer made of a piezoelectric material having an electromechanical conversion function between two electrodes.

For example, JP-A-2018-133458 discloses a piezoelectric element including a thin-film piezoelectric layer made of a perovskite type complex oxide containing potassium, sodium, and niobium.

In the piezoelectric element as described above, an internal stress may accumulate in the piezoelectric layer due to a temperature at the time of forming the piezoelectric layer, and cracks may occur in the piezoelectric layer.

SUMMARY

A piezoelectric element according to an aspect of the present disclosure includes: a first electrode; a second electrode; and a piezoelectric layer provided between the first electrode and the second electrode and including a plurality of layers containing a complex oxide having a perovskite type structure containing potassium, sodium, and niobium, in which an X-ray diffraction method is used to measure asymmetric reflection of the piezoelectric layer in a range in which $\sin^2\psi$ is 0 or more and 0.7 or less, ψ being a tilt angle, an obtained peak is separated into a high-angle-side peak and a low-angle-side peak, a lattice constant in a thickness direction of the piezoelectric layer is obtained based on the low-angle-side peak, and in a case where a plurality of the lattice constants are plotted for the range, when a plurality of plots are linearly approximated by a least squares method, a slope of an approximate straight line is 0.002 or less.

A liquid ejection head according to an aspect of the present disclosure includes: the piezoelectric element; a flow path forming substrate formed with a pressure generating chamber having a volume changed by the piezoelectric element; and a nozzle plate having a nozzle hole formed therein and communicating with the pressure generating chamber.

A printer according to an aspect of the present disclosure includes: the liquid ejection head; a conveyance mechanism configured to move a recording medium relative to the liquid ejection head; and a control unit configured to control the liquid ejection head and the conveyance mechanism.

BRIEF DESCRIPTION OF THE DRAWINGS

FIG. 10 is a table showing slopes of approximate straight lines in Examples 1 to 4 and Comparative Example 1.

DESCRIPTION OF EMBODIMENTS

Hereinafter, a preferred embodiment according to the present disclosure will be described in detail with reference to the drawings. The embodiment to be described below does not unduly limit contents of the present disclosure described in the claims. All the configurations to be described below are not necessarily essential elements of the present disclosure.

1. PIEZOELECTRIC ELEMENT

1.1. Configuration

Figure 1:
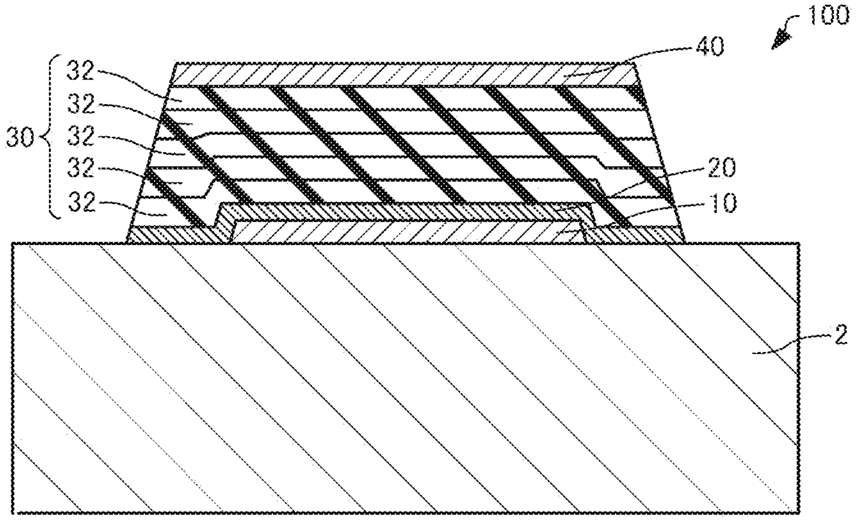
FIG. 1 is a cross-sectional view schematically showing a piezoelectric element according to an embodiment.

First, a piezoelectric element according to the embodiment will be described with reference to the drawings. FIG. 1 is a cross-sectional view schematically showing a piezoelectric element 100 according to the embodiment.

As shown in FIG. 1, the piezoelectric element 100 includes, for example, a first electrode 10, an orientation control layer 20, a piezoelectric layer 30, and a second electrode 40. The piezoelectric element 100 is provided on a substrate 2.

The substrate 2 is a flat plate formed of, for example, a semiconductor or an insulator. The substrate 2 may be a single layer, or a stack where a plurality of layers are stacked. An internal structure of the substrate 2 is not limited as long as an upper surface has a planar shape, and the substrate 2 may have a structure in which a space or the like is formed therein.

The substrate 2 may include a vibration plate that is deformed by an operation of the piezoelectric layer 30. The vibration plate is, for example, a silicon oxide layer, a zirconium oxide layer, or a stack in which a zirconium oxide layer is provided on a silicon oxide layer.

The first electrode 10 is provided on the substrate 2. The first electrode 10 is provided between the substrate 2 and the orientation control layer 20. The first electrode 10 has, for example, a layered shape. A thickness of the first electrode 10 is, for example, 5 nm or more and 300 nm or less, and preferably 50 nm or more and 200 nm or less.

The first electrode 10 is, for example, a titanium layer, a platinum layer, or an iridium layer. The first electrode 10 may be formed by stacking a titanium layer, a platinum layer, and an iridium layer in this order from a substrate 2 side. The titanium layer improves, for example, adhesion between the substrate 2 and the platinum layer. The first electrode 10 is one electrode for applying a voltage to the piezoelectric layer 30.

The orientation control layer 20 is provided on the first electrode 10. The orientation control layer 20 is provided between the first electrode 10 and the piezoelectric layer 30. In the illustrated example, the orientation control layer 20 is further provided on the substrate 2. A thickness of the orientation control layer 20 is, for example, 5 nm or more and 100 nm or less, and preferably 10 nm or more and 50 nm or less.

The orientation control layer 20 contains a complex oxide having a perovskite type structure containing bismuth (Bi), iron (Fe), titanium (Ti), and lead (Pb). The orientation control layer 20 is, for example, a bismuth lead ferrite titanate ((Bi, Pb)(Fe, Ti)$O_3$:BFTP) layer. The orientation control layer 20 may be a BFTP layer with an additive. The orientation control layer 20 controls an orientation of the piezoelectric layer 30.

The piezoelectric layer 30 is provided on the orientation control layer 20. The piezoelectric layer 30 is provided between the first electrode 10 and the second electrode 40. In the illustrated example, the piezoelectric layer 30 is provided between the orientation control layer 20 and the second electrode 40. A thickness of the piezoelectric layer 30 is, for example, 100 nm or more and 3000 nm or less, preferably 200 nm or more and 2000 nm or less, more preferably 600 nm or more and 2000 nm or less, and still more preferably more than 600 nm and 1000 nm or less. The thickness of the piezoelectric layer 30 is measured by a scanning electron microscope (SEM). The piezoelectric layer 30 has columnar crystals extending in a thickness direction of the piezoelectric layer 30 (hereinafter, also simply referred to as "thickness direction"). The piezoelectric layer 30 is deformed by applying a voltage between the first electrode 10 and the second electrode 40.

The piezoelectric layer 30 includes a plurality of crystal layers 32. The piezoelectric layer 30 is formed by, for example, a plurality of crystal layers 32. The number of crystal layers 32 is, for example, 2 or more and 30 or less, and preferably 3 or more and 20 or less. In the illustrated example, five crystal layers 32 are provided. A thickness of the crystal layer 32 is, for example, 10 nm or more and 200 nm or less, and preferably 30 nm or more and 150 nm or less.

The crystal layer 32 is a layer containing a complex oxide having a perovskite type structure containing potassium (K), sodium (Na), and niobium (Nb). The crystal layer 32 is, for example, a potassium sodium niobate ((K, Na)$NbO_3$:KNN) layer. The crystal layer 32 may be a KNN layer with an additive. Examples of the additive include lithium (Li), manganese (Mn), and copper (Cu). A content of the additive in the crystal layer 32 is, for example, 10 mol % or less, and preferably 5 mol % or less. The additive may be unevenly distributed in grain boundaries of the crystal layers 32.

The second electrode 40 is provided on the piezoelectric layer 30. Although not illustrated, the second electrode 40 may be further provided at a side surface of the piezoelectric layer 30 and the substrate 2 as long as the second electrode 40 is electrically separated from the first electrode 10. The second electrode 40 has, for example, a layered shape. A thickness of the second electrode 40 is, for example, 15 nm or more and 300 nm or less.

The second electrode 40 is, for example, a platinum layer, a titanium layer, or an iridium layer. The second electrode 40 may be formed by stacking a plurality of layers exemplified above. The second electrode 40 is another electrode for applying a voltage to the piezoelectric layer 30.

1.2. X-Ray Diffraction Method

A case where the X-ray diffraction (XRD) method is used for the piezoelectric layer 30 will be described. In the XRD, a tilt angle $\psi$ is changed to measure asymmetric reflection in which an incident angle and a reflection angle of X-rays are different. A measurement range of the asymmetric reflection is a range in which $\sin^2\psi$ is 0 or more and 0.7 or less. The measurement range may include a range in which $\sin^2\psi$ is larger than 0.7 as long as a range in which $\sin^2\psi$ is 0 or more and 0.7 or less is included. The XRD may be performed by thin film X-ray diffraction. The tilt angle $\psi$ is, for example, 0° or more and 90° or less.

A peak obtained by the XRD is separated into a high-angle-side peak and a low-angle-side peak. The peak separation is performed by a Gaussian function. The low-angle-side peak is a peak at a lower 2θ side of two peaks separated from each other. The high-angle-side peak is a peak at a higher 2θ side of the two peaks separated from each other.

A longitudinal lattice constant in the thickness direction is obtained based on a peak position of the low-angle-side peak. Specifically, the longitudinal lattice constant is obtained based on the peak position of the low-angle-side peak according to Bragg equation. The KNN layer has a tetragonal crystal structure. The longitudinal lattice constant is a lattice constant when an a-axis or c-axis, which is longer than a b-axis, is along the thickness direction. Similarly, a horizontal lattice constant in the thickness direction is obtained based on a peak position of the high-angle-side peak. The horizontal lattice constant is a lattice constant when the a-axis and c-axis are along a direction perpendicular to the thickness direction.

The longitudinal lattice constant is measured a plurality of times in a range in which $\sin^2\psi$ is 0 or more and 0.7 or less. The number of measurements is, for example, 5 times or more and 12 times or less, and preferably 7 times or more and 10 times or less. A plurality of longitudinal lattice constants are plotted for a range in which $\sin^2\psi$ is 0 or more and 0.7 or less. Similarly, the horizontal lattice constant is measured a plurality of times. A plurality of horizontal lattice constants are plotted.

In a case where a plurality of longitudinal lattice constants are plotted, when the plurality of plots are linearly approximated by a least squares method, a slope of an approximate straight line is 0.002 or less, preferably −0.012 or less, and more preferably −0.0121 or less. The slope of the approximate straight line may be −0.03 or more.

In a case where a plurality of horizontal lattice constants are plotted, when the plurality of plots are linearly approximated by the least squares method, a slope of an approximate straight line is, for example, −0.03 or less, and preferably −0.0387 or less. The slope of the approximate straight line may be −0.05 or more.

When the tilt angle $\psi$ is 0°, a difference between the longitudinal lattice constant and the horizontal lattice constant is, for example, 0.080 or more, and preferably 0.082 or more. The difference may be 0.10 or less.

Figure 2:
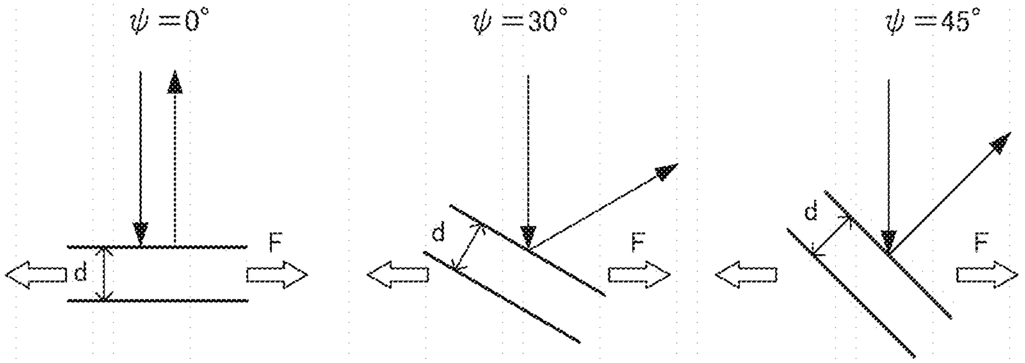
FIG. 2 is a diagram showing a relationship between a tilt angle ψ and inter-planar spacing d of a KNN layer.

Here, FIG. 2 is a diagram showing a relationship between the tilt angle $\psi$ and inter-planar spacing d of the KNN layer. When a tensile stress F generated in the KNN layer is large, the inter-planar spacing d becomes large. In the illustrated example, the tensile stress F is a stress that pulls the KNN layer in a direction perpendicular to a film thickness direction (hereinafter, also referred to as an "in-plane direction"). The in-plane direction may be a horizontal direction. When $\psi=0°$, the inter-planar spacing d in the in-plane direction is hardly affected by the tensile stress F. On the other hand, for example, a surface having an inclination with respect to the tensile stress F, such as $\psi=30°$ and 45° shown in FIG. 2, has larger inter-planar spacing d as the inclination is larger. The lattice constant estimated based on the inter-planar spacing d increases as $\psi$ increases. Therefore, the greater the slope of the approximate straight line, the greater the tensile stress F. Conversely, the smaller the slope of the approximate straight line, the smaller the tensile stress F.

1.3. Operation and Effect

The piezoelectric element 100 includes: the first electrode 10; the second electrode 40; and the piezoelectric layer 30 provided between the first electrode 10 and the second electrode 40 and including the plurality of crystal layers 32 containing the complex oxide having the perovskite type structure containing potassium, sodium, and niobium. The X-ray diffraction method is used to measure asymmetric reflection of the piezoelectric layer 30 in a range in which $\sin^2\psi$ is 0 or more and 0.7 or less, $\psi$ being the tilt angle, the obtained peak is separated into a high-angle-side peak and a low-angle-side peak, a lattice constant in the thickness direction of the piezoelectric layer 30 is obtained based on the low-angle-side peak, and in a case where the plurality of the lattice constants are plotted for the range, when a plurality of plots are linearly approximated by the least squares method, a slope of the approximate straight line is 0.002 or less.

As described above, the smaller the slope of the approximate straight line, the smaller the tensile stress F generated in the piezoelectric layer 30. In the piezoelectric element 100, since the slope of the approximate straight line is 0.002 or less, the tensile stress F generated in the piezoelectric layer 30 is small. Therefore, in the piezoelectric element 100, occurrence of cracks can be reduced.

When the tensile stress F generated in the piezoelectric layer is large, a crack occurs in the piezoelectric layer. On the other hand, when the tensile stress F is small and a compressive stress is dominant in the piezoelectric layer, cracks are less likely to occur in the piezoelectric layer. In the piezoelectric layer 30 of the piezoelectric element 100, the compressive stress is dominant.

In the piezoelectric element 100, the slope of the approximate straight line is −0.012 or less. Therefore, in the piezoelectric element 100, the tensile stress F generated in the piezoelectric layer 30 can be further reduced.

In the piezoelectric element 100, the thickness of the piezoelectric layer 30 is more than 600 nm and 2000 nm or less. Therefore, in the piezoelectric element 100, occurrence of cracks can be reduced.

The piezoelectric element 100 further includes the orientation control layer 20 provided between the first electrode 10 and the piezoelectric layer 30 and containing bismuth, iron, titanium, and lead. Therefore, in the piezoelectric element 100, the orientation of the piezoelectric layer 30 can be controlled.

In the piezoelectric element 100, when the tilt angle $\psi$ is 0°, a difference between a lattice constant in the thickness direction obtained based on the low-angle-side peak and a lattice constant in the thickness direction obtained based on the high-angle-side peak is 0.082 or more. Therefore, in the piezoelectric element 100, occurrence of cracks can be reduced.

2. METHOD OF MANUFACTURING PIEZOELECTRIC ELEMENT

Next, a method of manufacturing the piezoelectric element 100 according to the embodiment will be described with reference to the drawings.

As shown in FIG. 1, the substrate 2 is prepared. Specifically, a silicon oxide layer is formed by thermally oxidizing a silicon substrate. Next, a zirconium layer is formed on the silicon oxide layer by a sputtering method or the like, and the zirconium layer is thermally oxidized to form a zirconium oxide layer. The substrate 2 can be prepared by the above steps.

Next, the first electrode 10 is formed on the substrate 2. The first electrode 10 is formed by, for example, a sputtering method or a vacuum deposition method. The first electrode 10 is patterned, for example, by photolithography and etching.

Next, the orientation control layer 20 is formed on the first electrode 10 and the substrate 2. The orientation control layer 20 is formed by, for example, a chemical solution deposition (CSD) method such as a sol-gel method or a metal organic deposition (MOD) method.

Specifically, first, a precursor solution is prepared by dissolving or dispersing a metal complex containing bismuth, a metal complex containing iron, a metal complex containing titanium, and a metal complex containing lead in an organic solvent. Next, the precursor solution is applied onto the first electrode 10 by spin coating to form a precursor layer. Next, the precursor layer is heated, for example, at 130° C. or higher and 250° C. or lower and dried for a certain period of time, and the dried precursor layer is further heated, for example, at 300° C. or higher and 450° C. or lower and held for a certain period of time to be degreased. Next, the degreased precursor layer is crystallized by firing at, for example, 550° C. or higher and 800° C. or lower. As described above, the orientation control layer 20 made of the BFTP layer can be formed.

Next, the piezoelectric layer 30 is formed on the orientation control layer 20. The piezoelectric layer 30 is formed by, for example, a CSD method.

Specifically, first, for example, a metal complex containing potassium, a metal complex containing sodium, and a metal complex containing niobium are dissolved or dispersed in an organic solvent to prepare a precursor solution.

Examples of the metal complex containing potassium include potassium 2-ethylhexanoate and potassium acetate. Examples of the metal complex containing sodium include sodium 2-ethylhexanoate and sodium acetate.

Examples of the metal complex containing niobium include niobium 2-ethylhexanoate. The piezoelectric layer 30 is a layer formed from niobium 2-ethylhexanoate whose peak is not observed in a range of 3 ppm or more and 5 ppm or less in proton nuclear magnetic resonance (NMR) measurement. Therefore, the niobium 2-ethylhexanoate contains few impurities. The niobium 2-ethylhexanoate may be free of impurities.

Examples of the solvent include 2-ethylhexanoic acid, decane, and a mixed solvent thereof.

Next, the prepared precursor solution is applied onto the orientation control layer 20 by spin coating or the like to form a precursor layer. Next, the precursor layer is heated, for example, at 130° C. or higher and 250° C. or lower and dried for a certain period of time, and the dried precursor layer is further heated, for example, at 300° C. or higher and 450° C. or lower and held for a certain period of time to be degreased. Next, the degreased precursor layer is crystallized by firing at, for example, 550° C. or higher and 800° C. or lower.

By the above steps, the crystal layer 32 of the piezoelectric layer 30 can be formed. The above series of steps from the application of the precursor solution to the firing of the precursor layer are repeated a plurality of times. Accordingly, the piezoelectric layer 30 including a plurality of crystal layers 32 can be formed.

In forming the crystal layer 32, a heating device used for drying and degreasing the precursor layer is, for example, a hot plate. A heating device used for firing the precursor layer is an infrared lamp annealing (rapid thermal annealing: RTA) device.

Next, the second electrode 40 is formed on the piezoelectric layer 30. The second electrode 40 is formed by, for example, a sputtering method or a vacuum deposition method. Next, the second electrode 40 and the piezoelectric layer 30 are patterned by, for example, photolithography and etching. The second electrode 40 and the piezoelectric layer 30 may be patterned in separate steps.

The piezoelectric element 100 can be manufactured by the above steps.

3. LIQUID EJECTION HEAD

Figure 3:
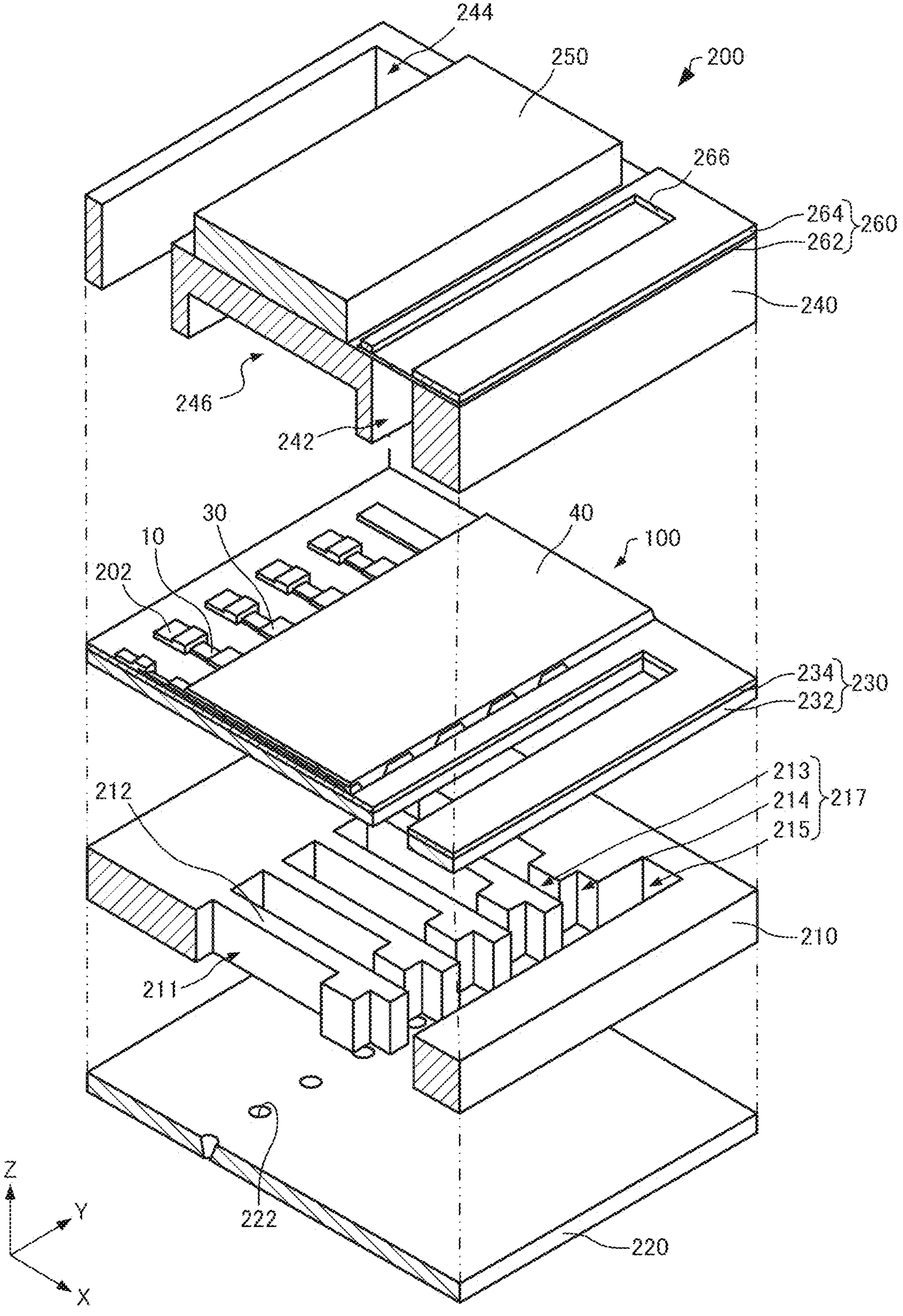
FIG. 3 is an exploded perspective view schematically showing a liquid ejection head according to the embodiment.
Figure 4:
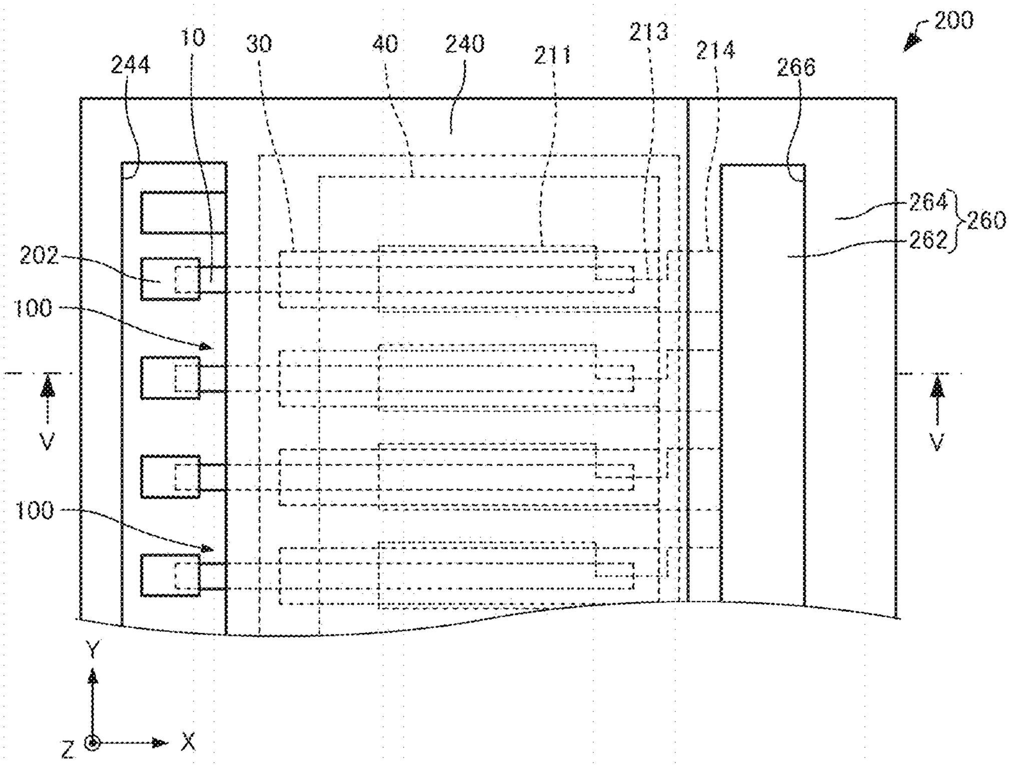
FIG. 4 is a plan view schematically showing the liquid ejection head according to the embodiment.
Figure 5:
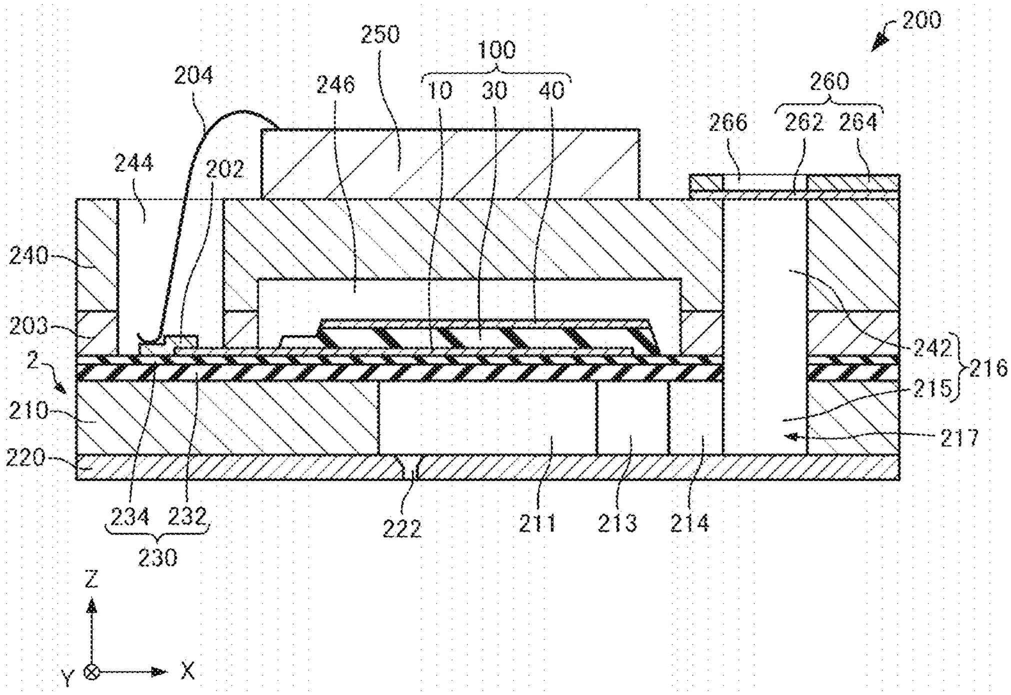
FIG. 5 is a cross-sectional view schematically showing the liquid ejection head according to the embodiment.

Next, the liquid ejection head according to the embodiment will be described with reference to the drawings. FIG. 3 is an exploded perspective view schematically showing a liquid ejection head 200 according to the embodiment. FIG. 4 is a plan view schematically showing the liquid ejection head 200 according to the embodiment. FIG. 5 is a cross-sectional view taken along a line V-V shown in FIG. 4, schematically showing the liquid ejection head 200 according to the embodiment. FIGS. 3 to 5 illustrate an X-axis, a Y-axis, and a Z-axis as three axes orthogonal to each other. In FIGS. 3 and 5, the piezoelectric element 100 is illustrated in a simplified manner.

As shown in FIGS. 3 to 5, the liquid ejection head 200 includes, for example, the substrate 2, the piezoelectric element 100, a nozzle plate 220, a protective substrate 240, a circuit substrate 250, and a compliance substrate 260. The substrate 2 includes a flow path forming substrate 210 and a vibration plate 230. For convenience, in FIG. 4, the circuit substrate 250 is not illustrated.

The flow path forming substrate 210 is, for example, a silicon substrate. A pressure generating chamber 211 is formed in the flow path forming substrate 210. The pressure generating chamber 211 is divided by a plurality of partition walls 212. A volume of the pressure generating chamber 211 is changed by the piezoelectric element 100.

A first communication path 213 and a second communication path 214 are formed at an end portion in a +X-axis direction of the pressure generating chamber 211 on the flow path forming substrate 210. The first communication path 213 is implemented in a manner that an opening area is reduced by narrowing the end portion in the +X-axis direction of the pressure generating chamber 211 from a Y-axis direction. A size of the second communication path 214 in the Y-axis direction is, for example, the same as a size of the pressure generating chamber 211 in the Y-axis direction. A third communication path 215 communicating with the plurality of second communication paths 214 is formed in the +X-axis direction of second communication path 214. The third communication path 215 constitutes a part of a manifold 216. The manifold 216 serves as a common liquid chamber for each of the pressure generating chambers 211. Thus, a supply flow path 217 including the first communication path 213, the second communication path 214, and the third communication path 215, and the pressure generating chamber 211 are formed in the flow path forming substrate 210. The supply flow path 217 communicates with the pressure generating chamber 211 and supplies liquid to the pressure generating chamber 211.

The nozzle plate 220 is provided on one surface of the flow path forming substrate 210. A material for the nozzle plate 220 is, for example, steel use stainless (SUS). The nozzle plate 220 is bonded to the flow path forming substrate 210 by, for example, an adhesive or a heat-welded film. A plurality of nozzle holes 222 are formed in the nozzle plate 220 along the Y-axis. The nozzle hole 222 communicates with the pressure generating chamber 211 and discharges liquid.

The vibration plate 230 is provided on the other surface of the flow path forming substrate 210. The vibration plate 230 includes, for example, a silicon oxide layer 232 provided on the flow path forming substrate 210 and a zirconium oxide layer 234 provided on the silicon oxide layer 232.

The piezoelectric element 100 is provided, for example, on the vibration plate 230. For example, a plurality of piezoelectric elements 100 are provided. The number of the piezoelectric elements 100 is not particularly limited. For convenience, in FIG. 4, the orientation control layer 20 is not illustrated.

In the liquid ejection head 200, the vibration plate 230 and the first electrode 10 are displaced by the deformation of the piezoelectric layer 30 having electromechanical conversion characteristics. That is, in the liquid ejection head 200, the vibration plate 230 and the first electrode 10 substantially function as a vibration plate. The vibration plate 230 may be omitted, and only the first electrode 10 may function as the vibration plate. When the first electrode 10 is directly provided on the flow path forming substrate 210, it is preferable to protect the first electrode 10 by an insulating protective film or the like so that the first electrode 10 is not brought into contact with the liquid.

The first electrode 10 is formed as an individual electrode independent for each pressure generating chamber 211. A size of the first electrode 10 in the Y-axis direction is smaller than a size of the pressure generating chamber 211 in the Y-axis direction. A size of the first electrode 10 in an X-axis direction is larger than a size of the pressure generating chamber 211 in the X-axis direction. In the X-axis direction, both end portions of the first electrode 10 are located outside both end portions of the pressure generating chamber 211. A lead electrode 202 is coupled to an end portion of the first electrode 10 in a −X-axis direction.

A size of the piezoelectric layer 30 in the Y-axis direction is, for example, larger than the size of the first electrode 10 in the Y-axis direction. A size of the piezoelectric layer 30 in the X-axis direction is, for example, larger than the size of the pressure generating chamber 211 in the X-axis direction. An end portion of the piezoelectric layer 30 in the +X-axis direction is, for example, located outside an end portion of the first electrode 10 in the +X-axis direction. The end portion of the first electrode 10 in the +X-axis direction is covered by the piezoelectric layer 30. On the other hand, an end portion of the piezoelectric layer 30 in the −X-axis direction is, for example, located inside an end portion of the first electrode 10 in the −X-axis direction. The end portion of the first electrode 10 in the −X-axis direction is not covered by the piezoelectric layer 30.

The second electrode 40 is, for example, provided continuously on the piezoelectric layer 30 and the vibration plate 230. The second electrode 40 is implemented as a common electrode shared by a plurality of piezoelectric elements 100.

The protective substrate 240 is bonded to the flow path forming substrate 210 by an adhesive 203. A through hole 242 is formed in the protective substrate 240. In the illustrated example, the through hole 242 penetrates the protective substrate 240 in a Z-axis direction and communicates with the third communication path 215. The through hole 242 and the third communication path 215 constitute the manifold 216 serving as the common liquid chamber for each of the pressure generating chambers 211. Further, the protective substrate 240 is formed with a through hole 244 that penetrates the protective substrate 240 in the Z-axis direction. An end portion of the lead electrode 202 is located in the through hole 244.

The protective substrate 240 is formed with an opening portion 246. The opening portion 246 is a space for not inhibiting driving of the piezoelectric element 100. The opening portion 246 may or may not be sealed.

The circuit substrate 250 is provided on the protective substrate 240. The circuit substrate 250 includes a semiconductor integrated circuit (IC) for driving the piezoelectric element 100. The circuit substrate 250 and the lead electrode 202 are electrically coupled via connection wiring 204.

The compliance substrate 260 is provided on the protective substrate 240. The compliance substrate 260 includes a sealing layer 262 provided on the protective substrate 240 and a fixing plate 264 provided on the sealing layer 262. The sealing layer 262 is a layer for sealing the manifold 216. The sealing layer 262 has, for example, flexibility. A through hole 266 is formed in the fixing plate 264. The through hole 266 penetrates the fixing plate 264 in the Z-axis direction. The through hole 266 is provided at a position overlapping the manifold 216 when viewed in the Z-axis direction.

4. PRINTER

Figure 6:
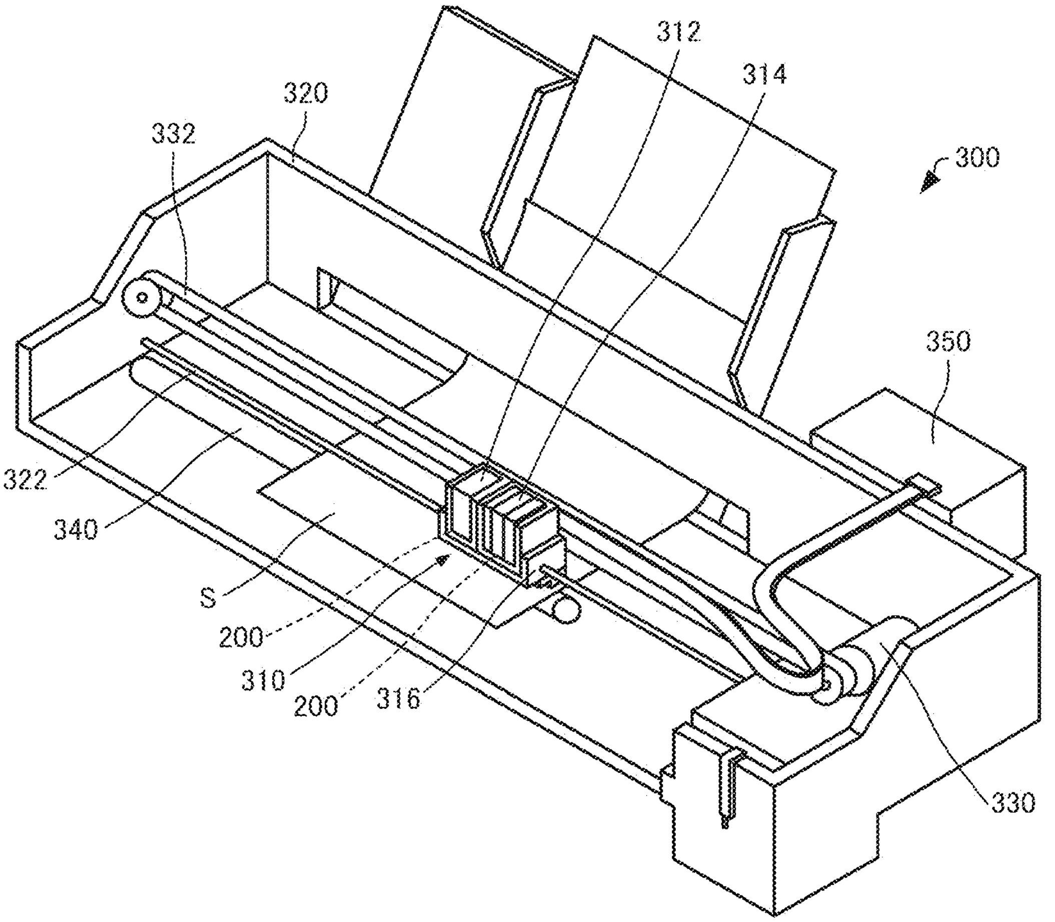
FIG. 6 is a perspective view schematically showing a printer according to the embodiment.

Next, the printer according to the embodiment will be described with reference to the drawings. FIG. 6 is a perspective view schematically showing a printer 300 according to the embodiment.

The printer 300 is an inkjet printer. As shown in FIG. 6, the printer 300 includes a head unit 310. The head unit 310 includes, for example, liquid ejection heads 200. The number of liquid ejection heads 200 is not particularly limited. The head unit 310 has detachable cartridges 312 and 314 constituting a supply unit. A carriage 316 on which the head unit 310 is mounted is provided on a carriage shaft 322 attached to a device main body 320 so as to be movable in an axial direction, and ejects liquid supplied from a liquid supply unit.

Here, the liquid refers to any material in a liquid phase, and liquid materials such as sols and gels are also in the liquid. The liquid includes not only the liquid as a state of a substance, but also liquid in which particles of a functional material made of a solid such as a pigment or a metal particle are dissolved, dispersed, or mixed in a solvent. Representative examples of the liquid include ink and liquid crystal emulsions. The term ink includes various types of liquid compositions such as general water-based ink, oil-based ink, gel ink, and hot melt ink.

In the printer 300, a driving force of a drive motor 330 is transmitted to the carriage 316 via a plurality of gears (not shown) and a timing belt 332, so that the carriage 316 on which the head unit 310 is mounted is moved along a carriage shaft 322. Meanwhile, the device main body 320 is provided with a conveyance roller 340 serving as a conveyance mechanism for moving a sheet S, which is a recording medium such as paper, relative to the liquid ejection head 200. The conveyance mechanism that conveys the sheet S is not limited to the conveyance roller, and may be a belt, a drum, or the like.

The printer 300 includes a printer controller 350 serving as a control unit that controls the liquid ejection head 200 and the conveyance roller 340. The printer controller 350 is electrically coupled to the circuit substrate 250 of the liquid ejection head 200. The printer controller 350 includes, for example, a random access memory (RAM) that temporarily stores various types of data, a read only memory (ROM) that stores control programs and the like, a central processing unit (CPU), and a drive signal generation circuit that generates drive signals to be supplied to the liquid ejection head 200.

The piezoelectric element 100 can be used in a wide range of applications, not limited to a liquid ejection head and a printer. The piezoelectric element 100 is suitably used as, for example, an ultrasonic motor, a vibrating dust removal device, a piezoelectric transformer, a piezoelectric speaker, a piezoelectric pump, and a piezoelectric actuator in a pressure-electricity conversion device. The piezoelectric element 100 is suitably used as, for example, a piezoelectric sensor element such as an ultrasonic detector, an angular velocity sensor, an acceleration sensor, a vibration sensor, a tilt sensor, a pressure sensor, a collision sensor, a human sensor, an infrared sensor, a terahertz sensor, a heat detection sensor, a pyroelectric sensor, and a piezoelectric sensor. The piezoelectric element 100 is suitably used as a ferroelectric element such as a ferroelectric memory (FeRAM), a ferroelectric transistor (FeFET), a ferroelectric calculation circuit (FeLogic), and a ferroelectric capacitor. The piezoelectric element 100 is suitably used as a voltage-controlled optical element such as a wavelength converter, an optical waveguide, an optical path modulator, a refractive index control element, and an electronic shutter mechanism.

5. EXAMPLES AND COMPARATIVE EXAMPLE

5.1. Preparation of Samples

5.1.1. Example 1

A front surface of a single crystal silicon substrate was thermally oxidized to form a $SiO_2$ layer having a thickness of 1460 nm. Next, a Zr film having a thickness of 400 nm was formed by a direct current (DC) sputtering method, and a $ZrO_2$ layer was formed by a heat treatment at 850° C.

Next, as a first electrode, a Ti layer, a Pt layer, and an Ir layer having thicknesses of 20 nm, 80 nm, and 5 nm, respectively, were formed on the $ZrO_2$ layer by a DC sputtering method.

Next, a BFTP precursor solution was prepared so as to have a molar ratio of Bi:Pb:Fe:Ti=110:10:50:50. Then, the prepared BFTP precursor solution was applied onto the Ir layer and the $ZrO_2$ layer by a spin coating method, dried at 180° C. for 3 minutes, degreased at 380° C. for 3 minutes, and fired at 650° C. for 3 minutes. As described above, a BFTP layer having a thickness of 20 nm was formed.

Next, a simple solution containing potassium 2-ethylhexanoate, sodium 2-ethylhexanoate, and niobium 2-ethylhexanoate was synthesized. A mixed solvent of 2-ethylhexanoic acid and decane was used as a solvent. A volume ratio of 2-ethylhexanoic acid to an entire solvent (hereinafter also referred to as "solvent ratio") is 0.42. These simple solutions were prepared so as to be $(K_{0.50}Na_{0.50})_{1.015}NbO_x$ (where x is any number larger than 0) to obtain a KNN precursor solution. A concentration of the KNN precursor solution (hereinafter also referred to as a "KNN concentration") was 45 vol %. The "KNN concentration" is a sum of a volume of the potassium 2-ethylhexanoate, a volume of sodium 2-ethylhexanoate, and a volume of niobium 2-ethylhexanoate, relative to a volume of the entire solution.

Figure 7:
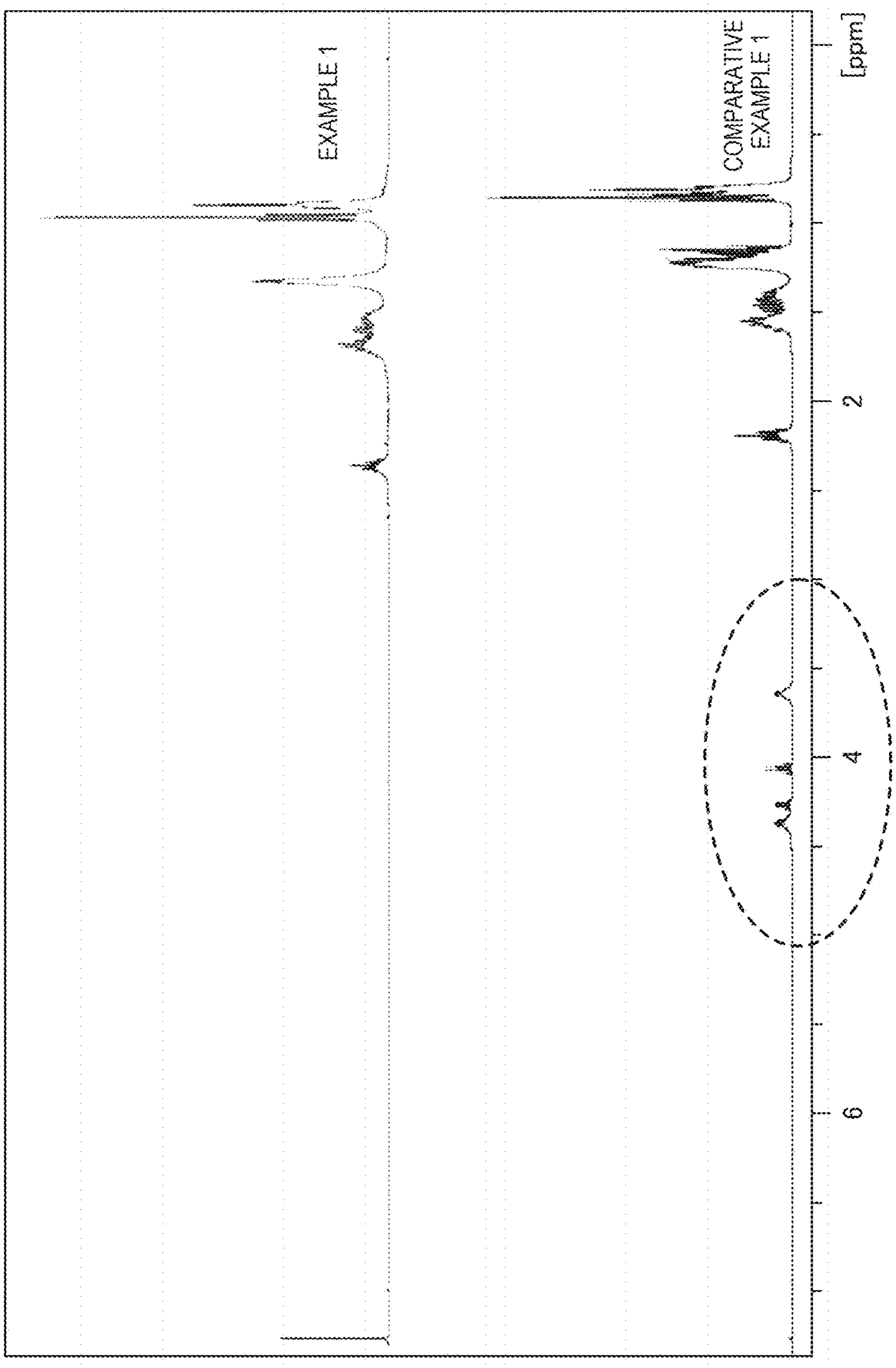
FIG. 7 shows the results of proton NMR measurement of niobium 2-ethylhexanoate used in a KNN precursor solution.

Here, FIG. 7 shows results of proton NMR measurement of the niobium 2-ethylhexanoate used in the KNN precursor solution. As an NMR device, "Ascend TM 400" manufactured by Bruker Corporation was used. Data analysis was performed using "TopSpin 4.2.0" manufactured by Bruker Corporation. $CDCl_3$ (400 MHZ, δ:7.26 ppm) was used as a deuterated solvent. Specifically, deuterated chloroform was used as a solvent and also as a standard substance, and a peak of the deuterated chloroform was set at 7.26 ppm for measurement.

As in "Example 1" shown in FIG. 7, no peak was observed in a range of 3 ppm or more and 5 ppm or less in an NMR measurement profile of the niobium 2-ethylhexanoate. The KNN precursor solution was prepared using such niobium 2-ethylhexanoate.

Next, the prepared KNN precursor solution was applied onto the BFTP layer by a spin coating method, dried at 180° C. for 3 minutes, degreased at 380° C. for 3 minutes, and fired at 700° C. for 3 minutes. A heating rate for firing was 10° C./sec. As described above, a crystal layer having a thickness of 80 nm was formed. Then, a series of steps from the application of the KNN precursor solution to the firing of the KNN precursor layer was repeated five times to form a piezoelectric layer having a thickness of 400 nm and containing five crystal layers.

Next, a Pt layer having a thickness of 50 nm was formed on the piezoelectric layer by a DC sputtering method. Thereafter, the Pt layer was patterned by photolithography and etching to form a second electrode.

As described above, the piezoelectric element in Example 1 was formed.

5.1.2. Example 2

A piezoelectric element in Example 2 was formed in a similar manner as in Example 1, except that the solvent ratio in the KNN precursor solution was set to 0.67.

5.1.3. Example 3

A piezoelectric element in Example 3 was formed in a similar manner as in Example 1, except that the solvent ratio in the KNN precursor solution was set to 0.30.

5.1.4. Example 4

A piezoelectric element in Example 4 was formed in a similar manner as in Example 1, except that a concentration of the KNN precursor solution was 25 vol % in the KNN precursor solution.

5.1.5. Comparative Example 1

As in "Comparative Example 1" shown in FIG. 7, a KNN precursor solution was prepared using niobium 2-ethylhexanoate whose peak was observed in the range of 3 ppm or more and 5 ppm or less in an NMR measurement profile. Except for this, a piezoelectric element in Comparative Example 1 was formed in a similar manner as in Example 1.

The peak in the range of 3 ppm or more and 5 ppm or less observed in "Comparative Example" in FIG. 7 is a peak derived from impurities such as by-produced ethanol and an ethoxy group derived from a raw material. In FIG. 7, the peak is surrounded by a broken line.

5.2. XRD

For the XRD measurement, "D8 DISCOVER with GADDS" manufactured by Bruker Corporation was used. Asymmetric reflection was measured at ω-2θ while gradually tilting the tilt angle ψ. A collimator had a diameter of 1 mm. For each ψ, a plane index peak detected according to the Bragg equation was separated into a high-angle-side peak and a low-angle-side peak using a Gaussian function. According to the Bragg equation, a longitudinal lattice constant was calculated based on a peak position 2θ of the low-angle-side peak, and a horizontal lattice constant was calculated based on a peak position 2θ of the high-angle-side peak.

Figure 8:
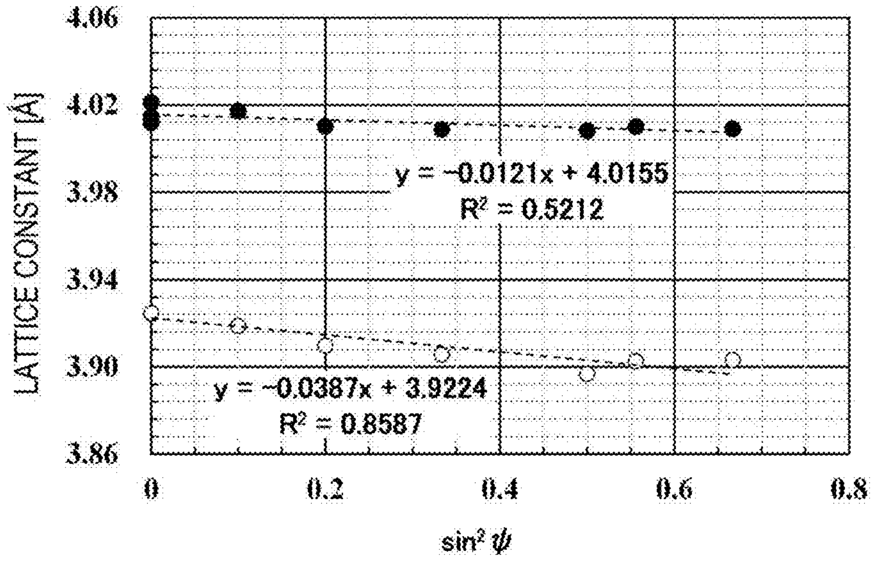
FIG. 8 is a graph in which longitudinal lattice constants and horizontal lattice constants calculated at each of tilt angles ψ are plotted with respect to $\sin^2\psi$ in Example 1.
Figure 9:
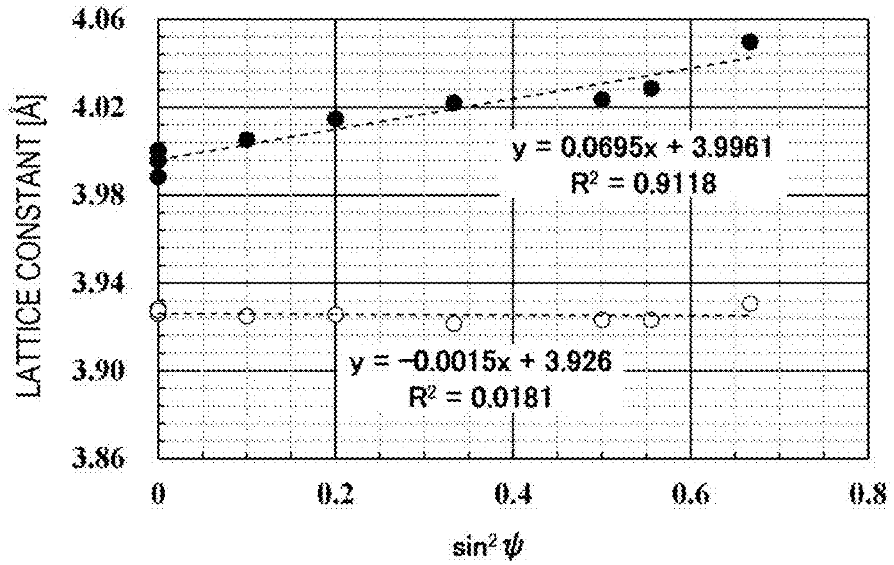
FIG. 9 is a graph in which longitudinal lattice constants and horizontal lattice constants calculated at each of tilt angles ψ are plotted with respect to $\sin^2\psi$ in Comparative Example 1.

FIG. 8 is a graph in which the longitudinal lattice constant and the horizontal lattice constant calculated at each ψ are plotted with respect to $\sin^2\psi$ in Example 1. In FIG. 8 and FIG. 9 to be described later, plots of the longitudinal lattice constants are shown as black circles, and plots of the horizontal lattice constants are shown as white circles. When linear approximation was performed by the least squares method for the range of $\sin^2\psi=0$ to 0.7, a slope of an approximate straight line was −0.0121 for the longitudinal lattice constant and −0.0387 for the horizontal lattice constant.

FIG. 9 is a graph in which the longitudinal lattice constants and horizontal lattice constants calculated at each ψ are plotted with respect to $\sin^2\psi$ in Comparative Example 1. When linear approximation was performed by the least squares method for the range of $\sin^2\psi=0$ to 0.7, a slope of an approximate straight line was 0.0695 for the longitudinal lattice constant and −0.0015 for the horizontal lattice constant.

FIG. 10 is a table showing slopes of approximate straight lines in Examples 1 to 4 and Comparative Example 1. As shown in FIG. 10, for both the longitudinal lattice constant and the horizontal lattice constant, the slopes of the approximate straight lines in Examples 1 to 4 were smaller than the slope of the approximate straight line in Comparative Example 1. From this, it was found that in Examples 1 to 4, a tensile stress generated in the KNN layer was smaller than that in Comparative Example 1. In Examples 1 to 4, the tensile stress generated in the KNN layer can be reduced because niobium 2-ethylhexanoate containing a small number of impurities is used.

5.3. KNN Layer Observation

In Examples 1 to 4 and Comparative Example 1, a thickness of the KNN layer was increased until a crack occurred in the KNN layer. FIG. 10 shows the thickness of the KNN layer where a crack occurs as "crack-resistant film thickness". The crack was observed using a metallurgical microscope.

As shown in FIG. 10, in Comparative Example 1, the crack was observed at a thickness of 600 nm. On the other hand, in Examples 1 to 4, no crack was observed even when the thickness is 1000 nm. In Examples 1 to 4, it was found that since the tensile stress generated in the KNN layer was small, a crack was unlikely to occur.

When cross-sectional morphology of the KNN layer was confirmed by SEM, the KNN layer was columnar in Examples 1 to 4 and was random in Comparative Example 1.

The embodiment and the modifications described above are examples, and the present disclosure is not limited thereto. For example, each of the embodiments and each of the modifications may be combined as appropriate.

The present disclosure includes substantially the same configurations as the configurations described in the embodiment, such as a configuration having the same function, method, and result and a configuration having the same object and effect. The present disclosure includes a configuration in which a non-essential portion of the configuration described in the embodiments is replaced. The present disclosure includes a configuration capable of achieving the same function and effect or a configuration capable of achieving the same object as the configuration described in the embodiments. The present disclosure includes a configuration obtained by adding a known technique to the configuration described in the embodiments.

The following contents are derived from the embodiment and the modifications described above.

A piezoelectric element according to an aspect includes: a first electrode; a second electrode; and a piezoelectric layer provided between the first electrode and the second electrode and including a plurality of layers containing a complex oxide having a perovskite type structure containing potassium, sodium, and niobium, in which an X-ray diffraction method is used to measure asymmetric reflection of the piezoelectric layer in a range in which $\sin^2\psi$ is 0 or more and 0.7 or less, $\psi$ being a tilt angle, an obtained peak is separated into a high-angle-side peak and a low-angle-side peak, a lattice constant in a thickness direction of the piezoelectric layer is obtained based on the low-angle-side peak, and in a case where a plurality of the lattice constants are plotted for the range, when a plurality of plots are linearly approximated by a least squares method, a slope of an approximate straight line is 0.002 or less.

According to the piezoelectric element, occurrence of cracks can be reduced.

In the piezoelectric element according to the aspect, the slope may be −0.012 or less.

According to the piezoelectric element, a tensile stress generated in the piezoelectric layer can be further reduced.

In the piezoelectric element according to the aspect, a thickness of the piezoelectric layer may be more than 600 nm and 2000 nm or less.

According to the piezoelectric element, occurrence of cracks can be reduced.

In the piezoelectric element according to the aspect, the piezoelectric element may further include an orientation control layer provided between the first electrode and the piezoelectric layer and containing bismuth, iron, titanium, and lead.

According to the piezoelectric element, an orientation of the piezoelectric layer can be controlled.

In the piezoelectric element according to the aspect, when the tilt angle is 0°, a difference between the lattice constant in the thickness direction obtained based on the low-angle-side peak and a lattice constant in the thickness direction obtained based on the high-angle-side peak may be 0.082 or more.

According to the piezoelectric element, occurrence of cracks can be reduced.

In the piezoelectric element according to the aspect, the piezoelectric layer may be a layer formed from niobium 2-ethylhexanoate whose peak is not observed in a range of 3 ppm or more and 5 ppm or less in proton NMR measurement.

According to the piezoelectric element, niobium 2-ethylhexanoate having few impurities can be used as a raw material.

A liquid ejection head according to an aspect includes: the piezoelectric element according to the aspect; a flow path forming substrate formed with a pressure generating chamber having a volume changed by the piezoelectric element; and a nozzle plate having a nozzle hole formed therein and communicating with the pressure generating chamber.

A printer according to an aspect includes: the liquid ejection head according to the aspect; a conveyance mechanism configured to move a recording medium relative to the liquid ejection head; and a control unit configured to control the liquid ejection head and the conveyance mechanism.

What is claimed is:

1. A piezoelectric element comprising:

a first electrode;

a second electrode; and a piezoelectric layer provided between the first electrode and the second electrode and including a plurality of layers containing a complex oxide having a perovskite type structure containing potassium, sodium, and niobium, wherein an X-ray diffraction method is used to measure asymmetric reflection of the piezoelectric layer in a range in which $\sin^2\psi$ is 0 or more and 0.7 or less, $\psi$ being a tilt angle, an obtained peak is separated into a high-angle-side peak and a low-angle-side peak, a lattice constant in a thickness direction of the piezoelectric layer is obtained based on the low-angle-side peak, and in a case where a plurality of the lattice constants are plotted for the range, when a plurality of plots are linearly approximated by a least squares method, a slope of an approximate straight line is 0.002 or less.

2. The piezoelectric element according to claim 1, wherein the slope is −0.012 or less.

3. The piezoelectric element according to claim 1, wherein a thickness of the piezoelectric layer is more than 600 nm and 2000 nm or less.

4. The piezoelectric element according to claim 1, further comprising:

an orientation control layer provided between the first electrode and the piezoelectric layer and containing bismuth, iron, titanium, and lead.

5. The piezoelectric element according to claim 1, wherein when the tilt angle is 0°, a difference between the lattice constant in the thickness direction obtained based on the low-angle-side peak and a lattice constant in the thickness direction obtained based on the high-angle-side peak is 0.082 or more.

6. The piezoelectric element according to claim 1, wherein the piezoelectric layer is a layer formed from niobium 2-ethylhexanoate whose peak is not observed in a range of 3 ppm or more and 5 ppm or less in proton NMR measurement.

7. A liquid ejection head comprising:

the piezoelectric element according to claim 1;

a flow path forming substrate formed with a pressure generating chamber having a volume changed by the piezoelectric element; and a nozzle plate having a nozzle hole formed therein and communicating with the pressure generating chamber.

8. A printer comprising:

the liquid ejection head according to claim 7;

a conveyance mechanism configured to move a recording medium relative to the liquid ejection head; and a control unit configured to control the liquid ejection head and the conveyance mechanism.

* * * * *